(12) United States Patent
Zueger

(10) Patent No.: US 7,523,896 B2
(45) Date of Patent: Apr. 28, 2009

(54) RESTRAINT DEVICE FOR ELECTRICAL WIRES AND CABLES

(75) Inventor: Richard Zueger, Montgomery, AL (US)

(73) Assignee: Miltope Corporation, Hope Hull, AL (US)

( * ) Notice: Subject to any disclaimer, the term of this patent is extended or adjusted under 35 U.S.C. 154(b) by 475 days.

(21) Appl. No.: 10/976,832

(22) Filed: Nov. 1, 2004

(65) Prior Publication Data

US 2006/0090304 A1    May 4, 2006

(51) Int. Cl.
*F16L 3/08* (2006.01)
*H01B 17/00* (2006.01)
*F16G 11/00* (2006.01)

(52) U.S. Cl. .................... 248/65; 248/51; 24/136 R; 174/168

(58) Field of Classification Search ............... 248/65, 248/51, 52, 70, 316.1, 316.6, 227.4; 24/136 R; 174/168
See application file for complete search history.

(56) References Cited

U.S. PATENT DOCUMENTS

| | | | | |
|---|---|---|---|---|
| 1,688,148 | A | * | 10/1928 | Martin .................. 248/229.12 |
| 2,650,978 | A | * | 9/1953 | Findlay ....................... 174/168 |
| 2,931,607 | A | * | 4/1960 | McFarland ................. 248/74.1 |
| 3,140,069 | A | * | 7/1964 | McBurney et al. .......... 248/514 |
| 3,175,263 | A | * | 3/1965 | Bernstein ..................... 248/49 |
| 3,664,620 | A | * | 5/1972 | Branum ........................ 248/63 |
| 4,431,244 | A | | 2/1984 | Anhalt et al. |
| 4,538,875 | A | | 9/1985 | Krenz |
| 4,640,984 | A | | 2/1987 | Kalbfeld |
| 4,653,832 | A | | 3/1987 | Sanchez |
| 4,842,549 | A | | 6/1989 | Asick et al. |
| 4,842,550 | A | | 6/1989 | Fry et al. |
| 4,846,725 | A | * | 7/1989 | Williams et al. ............ 439/479 |
| 4,853,625 | A | * | 8/1989 | Fodali et al. ................ 324/754 |
| 5,288,241 | A | | 2/1994 | Davidge et al. |
| 5,305,978 | A | * | 4/1994 | Current .................... 248/230.4 |
| 5,507,644 | A | | 4/1996 | Carmo |
| 5,622,341 | A | * | 4/1997 | Stana ........................ 248/74.1 |
| 5,672,847 | A | | 9/1997 | Piatt |
| 5,804,765 | A | | 9/1998 | Siemon et al. |
| 5,979,840 | A | * | 11/1999 | Hollister et al. ............... 248/76 |
| 6,126,122 | A | * | 10/2000 | Ismert ....................... 248/74.1 |
| 6,203,361 | B1 | | 3/2001 | McGaffin |
| 6,302,721 | B1 | | 10/2001 | Turner et al. |
| 6,446,915 | B1 | * | 9/2002 | Ismert ....................... 248/68.1 |
| 6,463,631 | B2 | * | 10/2002 | Noda .......................... 24/16 R |
| 6,464,530 | B1 | | 10/2002 | Smith et al. |
| 6,482,017 | B1 | | 11/2002 | Van Doorn |

(Continued)

*Primary Examiner*—Anita M King
(74) *Attorney, Agent, or Firm*—Merek, Blackmon & Voorhees, LLC

(57) ABSTRACT

A restraint device including a catch defining a space for receiving a wire and a movable member mounted for movement between a first position, in which the member is spaced from the catch, such that a wire is able to be inserted sideways into the space, and a second position, in which the movable member prevents the wire from being inserted sideways into the space. A biasing device resiliently urges the movable member toward the second position, such that the movable member clamps the wire against the catch. The restraint device is mounted on the casing of a computer or the like, or on a mounting member securable in or across an opening in the casing. One or more of the restraint devices can be mounted on a mounting member.

21 Claims, 4 Drawing Sheets

U.S. PATENT DOCUMENTS

| | | |
|---|---|---|
| 6,491,541 B2 | 12/2002 | Wakino |
| 6,523,231 B1 * | 2/2003 | Lassiter ................. 24/339 |
| 6,602,088 B1 | 8/2003 | Zhu |
| 6,702,237 B2 | 3/2004 | Rubenstein et al. |
| 6,733,328 B2 | 5/2004 | Lin et al. |
| 7,025,621 B2 * | 4/2006 | Mossner et al. ............. 439/395 |
| 7,223,918 B2 * | 5/2007 | Gelibert ................. 174/95 |

* cited by examiner

RESTRAINT DEVICE FOR ELECTRICAL WIRES AND CABLES

BACKGROUND OF THE INVENTION

The present invention relates to a restraining device for wires and/or cables and, more particularly, to a restraining device for providing strain relief and preventing unintentional disconnection of electrical wires, especially computer accessory wires and/or cables.

Personal computers, for example, those of the desktop and notebook types, have been well developed and are commercially available. Many computer systems, including personal computers, workstations and servers, are designed to have multiple peripheral devices included in the system. Generally, a typical personal computer system includes a number of peripheral devices that provide input and output (I/O) for the system. Such peripheral devices include compact disc read only memory (CD-ROM) drives, hard disc drives (HDD), floppy disc drives, digital versatile disk drives (DVD), keyboards, mouses and printers.

The primary method of expanding the functional ability of personal computers is through the use of external devices that connect to the personal computer via a signal transmission device. The most common signal transmission devices are wires or cables that connect to the personal computer, such as a power cord, a USB cable, an IEEE 1394 cable, etc. Such wires and/or cables are subject to pulls in everyday use that place strain on the connectors, resulting in unintentional disconnection of the wire and/or cable and damage to the connectors. This is especially true of computers that operate in a rugged environment, such as in military service.

Known devices include the PCMCIA card cable strain relief mechanism used on the MSD-B, and wire routing Kwik Klips manufactured by Richco. These devices use a loop under which the cables are placed, the loop then being pushed closed and held in place by ratcheting features in the loop and a base. However, the PCMCIA card cable strain relief mechanism is too large physically for the available areas in some applications, and the Kwik Klips are mounted by pressure sensitive adhesive, which does not meet the life expectancy requirements of some applications and does not work with cables having small diameters.

SUMMARY OF THE INVENTION

An object of the present invention is to provide a restraint device that securely holds computer accessory wires and/or cables for strain relief and for preventing unintentional disconnection of the wires and/or cables and damage to the connectors in which the wires and/or cables terminate. The restraint device according to the present invention has the features of compact size, secure mounting method, easy operation and ability to maintain its functionality for the lifetime of the equipment with which it is used. In providing strain relief, the restraint device according to the present invention is capable of withstanding a static force of 5 pounds and a dynamic force of 10 pounds for 500 milliseconds.

The present invention comprises a housing containing a finger-operated, spring-loaded, sliding movable member or clamping device. The movable member slides on a shaft in the housing to provide an opening for a computer accessory wire and/or cable to enter, whereby the wire and/or cable is positioned under a catch. The housing also contains a spring to cause the movable member to apply a clamping force against the computer accessory wire and/or cable. This arrangement provides strain relief and securely holds the wire and/or cable in position under the catch. The clamping force prevents the wire and/or cable from being disconnected unintentionally. In accordance with the present invention, one or more restraint devices are secured to a mounting member to define a restraint apparatus mountable as a unit. The present invention also comprises a method of restraining a wire from movement.

DETAILED DESCRIPTION OF THE PREFERRED EMBODIMENT

Figure 1:
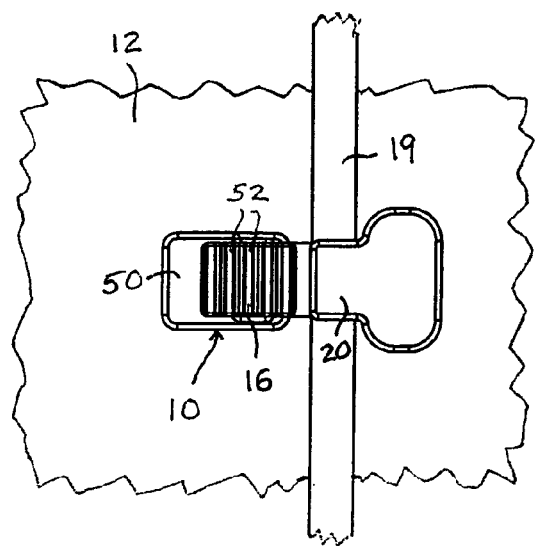
FIG. 1 is a front elevation of a restraint device according to the present invention mounted on a casing of, for example, a computer.
Figure 2:
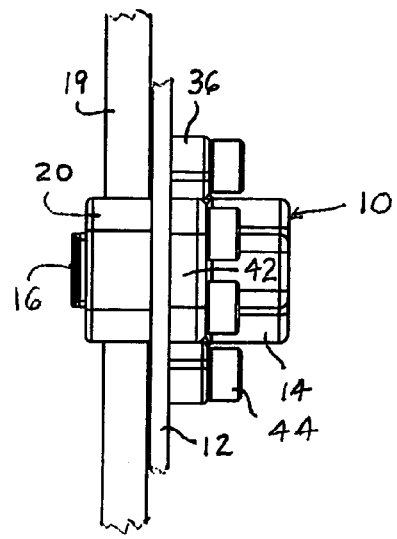
FIG. 2 is a right side elevation of the restraint device of FIG. 1.
Figure 4:
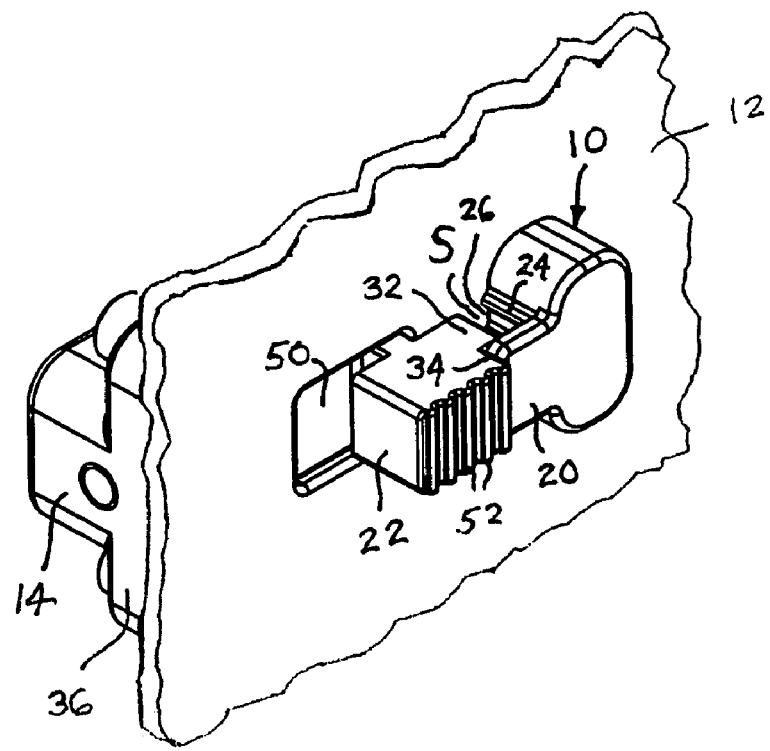
FIG. 4 is an isometric view, taken from the front, top and left side, of the restraint device of FIG. 1.
Figure 5:
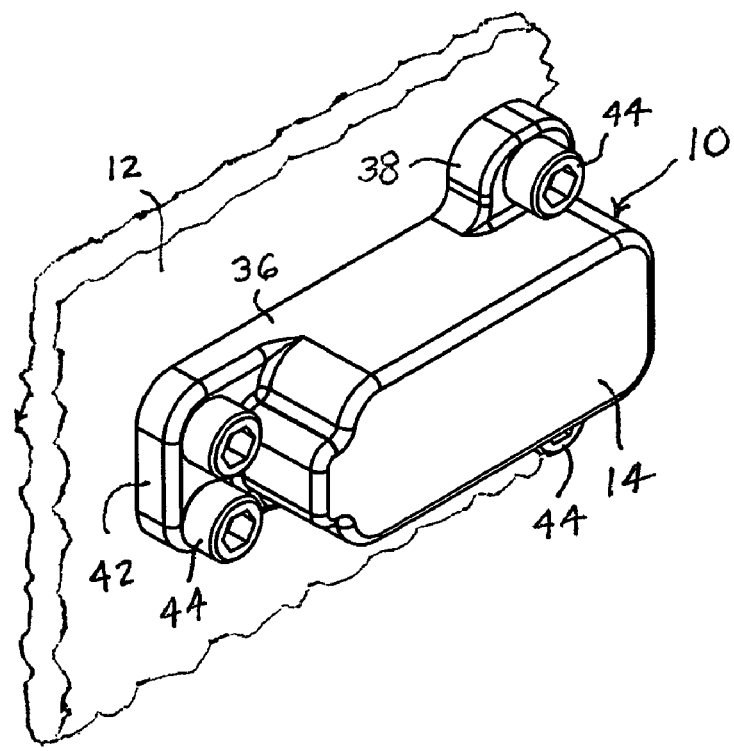
FIG. 5 is an isometric view, taken from the rear, top and right side, of the restraint device of FIG. 1.

As can be seen from FIG. 1, a restraint device according to the present invention, which is designated generally by the reference numeral 10, is in the form of a clamping device and is mounted on a casing 12 of, for example, a computer. Only a portion of a wall of the casing 12 is shown, and it is broken away. A plurality of the restraint devices can be mounted on the casing 12. Alternatively, one or more of the restraint devices can be mounted on a plate or other member to define a restraint device according to the present invention that is secured in or across an opening in the casing 12.

Figure 6:
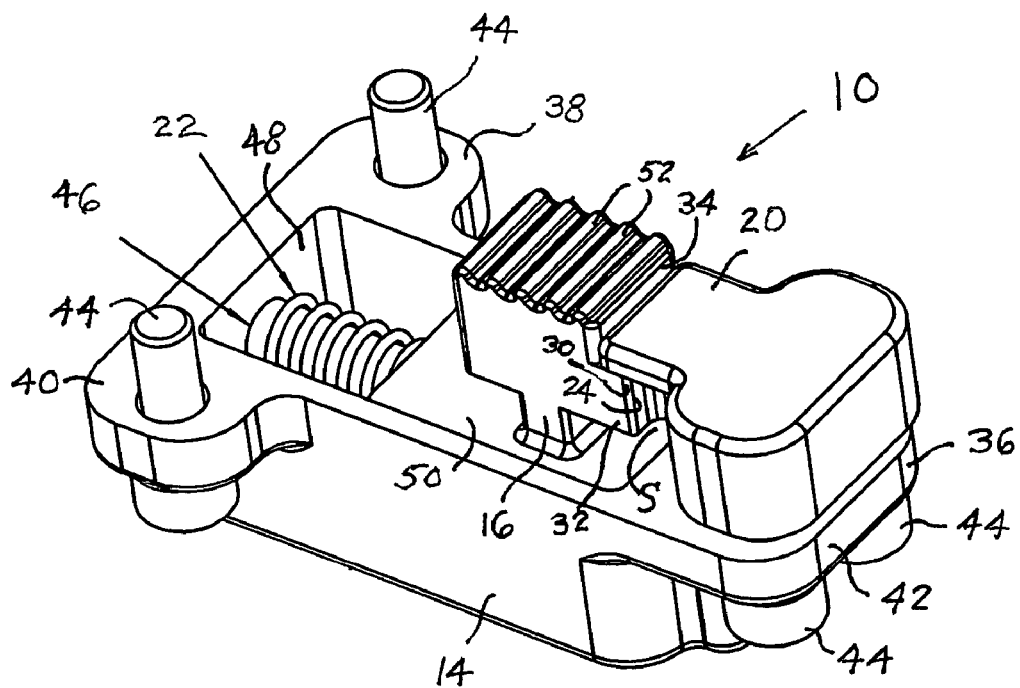
FIG. 6 is an isometric view, taken from the front, bottom and right side, of the restraint device of FIG. 1, without a casing.

The restraint device 10 according to the present invention comprises a housing 14 containing a movable member 16 in the form of a finger-operated, spring-loaded, sliding first clamping element. The movable member 16 slides on a shaft 46 (FIG. 6) in the housing 14 to provide an opening for a computer accessory wire 19 and/or cable to enter a space S defined by and positioned under a catch 20. For simplicity of expression, the term "wire" will be used alone hereinafter, it being understood that "wire" is intended to encompass any wire, cable, or similar device, especially any such device designed to conduct electrical current, and most especially in connection with a computer. The housing 14 also contains an urging structure 22, for example, a spring, to apply a clamping force against the wire 19 that provides strain relief and securely holds the wire in position under the catch 20. The clamping force prevents the wire 19 from being disconnected unintentionally from the computer or other electrical device to which it is connected.

The movable member 16 is mounted for movement relative to the catch 20 between a first position, in which the movable member is spaced from the catch, such that the wire 19 is able to be inserted sideways into the space S defined by the catch, and a second position, in which the movable member prevents the wire from being inserted sideways into the space. The urging structure 22 resiliently urges the movable member 16 toward the second position. The urging structure 22 can include a spring, either as a distinct member, as shown in FIG.

6, or formed in one piece with a member on which the movable member 16 is mounted. When the wire 19 is in the space S, and the movable member 16 is in its second position, the movable member clamps the wire against the catch 20. The space S has a perimeter, the catch 20 borders approximately half of the perimeter of the space, and the space receives the wire 19 sideways, that is, in a direction generally perpendicular to the length of the wire.

Figure 3:
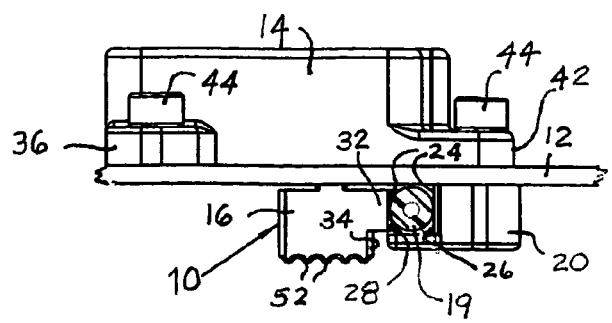
FIG. 3 is a top plan view of the restraint device of FIG. 1.

As can be appreciated from FIG. 3, at least one of the catch 20 and the movable member 16 has a friction-enhancing surface 24 facing the space S. The friction-enhancing surface 24 can take a variety of forms, including a roughened surface, a tacky surface, ridges, and the like. In the illustrated embodiment, each of the catch 20 and the movable member 16 has at least one ridge extending transverse to the length of the wire 19 and parallel to the perimeter of the space. In the second position of the movable member 16, the ridges engage the sides of the wire 19 and help prevent the wire from being pulled lengthwise.

The catch 20 has a first surface 26, and a second surface 28 extending at angle from the first surface, the first and second surfaces bordering the space S, and the second surface having a dimension parallel to the perimeter of the space. The friction-enhancing surface 24 of the movable member 16 is on a side of the movable member facing the space S; the side has a front surface 30 having a dimension parallel to the perimeter of the space; and the dimension of the front surface of the movable member is generally equal to the dimension of the first surface of the catch 20. The front surface 30 is on a protruding portion 32 of the side of the movable member 16 facing the space, and the second surface 28 of the catch 20 has a free end adjacent to the movable member. If the diameter of the wire 19 is smaller than the dimension of the second surface 28 of the catch 20 in a direction parallel to the perimeter of the space S, the protruding portion 32 of the movable member overlaps the free end of the second surface of the catch. The side of the movable member 16 facing the space has a shoulder 34, and, in the second position of the movable member, the shoulder engages the free end of the second surface 28 of the catch 20.

The movable member 16 is movably mounted on a base member 36, and the catch 20 is connected to the base member. The base member 36 includes the housing 14; the movable member 16 is movably mounted in the housing; and the urging structure 22 is positioned in the housing. The base member 36 further includes mounting flanges 38, 40 and 42 extending from the housing 14, the base member being secured to the casing 12 of an electrical device, or to a mounting member, by screws 44 or other fasteners extending through the mounting flanges. The catch 20 is connected to the base member 36 by the screws 44 extending through the mounting flange 42, the base member contacting one surface of the casing or a mounting member, and the catch contacting an opposite surface. The catch 20 and the movable member 16 protrude from said opposite surface of the casing or mounting member.

The space S is also defined by the surface of the casing or mounting member from which the catch 20 and the movable member 16 protrude. The catch 20 borders approximately half of the perimeter of the space and has a free end, which is also the free end of the second surface 28. A gap is defined between the free end of the catch 20 and the surface of the casing or mounting member, and, in the first position of the movable member 16, the wire 19 is insertable sideways through the gap and into the space S. In the second position of the movable member 16, the movable member closes the gap, unless the wire 19 is so large as to protrude from the space S.

The movable member 16 is movably mounted in the housing 14, and the urging structure 22 is positioned in the housing. As can be seen from FIG. 6, in the illustrated embodiment, the urging structure 22 comprises a coil spring, and the coil spring is positioned around a shaft 46 extending from one wall of the housing 14 into a chamber 48 defined in the housing. A body portion 50 of the movable member 16 is also positioned in the chamber 48, adjacent to the urging structure 22, and is mounted for sliding on the shaft 46. The urging structure 22 engages the body portion 50 and resiliently biases the movable member 16 away from the wall of the housing 14 on which the shaft 46 is mounted and toward the catch 20. The movable member 16 is designed to be engaged by a finger to be moved against the force of the urging structure 22. In this regard, the movable member 16 has a friction-enhancing surface to help keep a finger from slipping. In the illustrated embodiment, the friction-enhancing surface comprises a plurality of ridges 52 extending transverse to the line of movement of the movable member 16 between the first and second positions. The friction-enhancing surface extends beyond the catch 20 in a direction away from the base member 36 of the restraining device 10. The friction-enhancing surface designed to help keep a finger from slipping can take a variety of other forms, including a roughened surface, a tacky surface, a single ridge, and the like.

Figure 7:
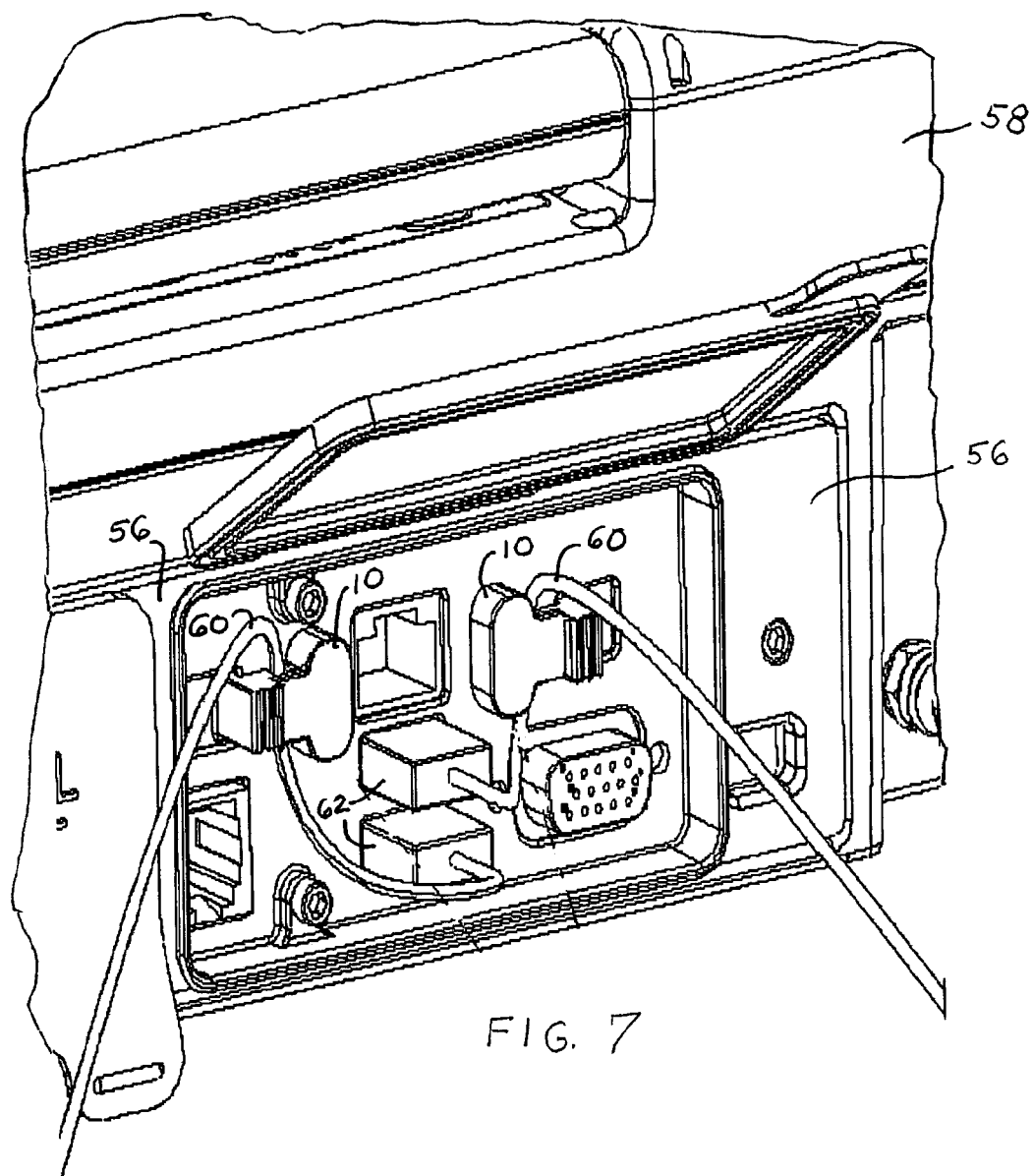
FIG. 7 is an isometric view of a plurality of the restraint devices of FIG. 1 secured on a mounting member mounted on a computer casing.

As can be seen in FIG. 7, two of the restraint devices 10 can be secured to a mounting member 56 in the form of, for example, a plate or panel that is mounted in or across an opening in a casing 58 of a computer or other electrical device. The restraint devices 10 are shown restraining wires 60 that terminate in connectors 62 electrically connecting the wires to the computer. It can be appreciated that the mounting member 56 can take other forms and/or that any number of restraint devices 10, including one, can be secured to the mounting member.

In a method according to the present invention for restraining the wire 19 from movement, an encircling structure that comprises, for example, the movable member 16, the catch 22 and either the casing of an electrical device or a mounting member, encircles a space S through which the wire can extend. The encircling structure is opened by moving a portion of the encircling structure, for example, the movable member 16, away from the space against the force of an urging structure 22 that urges the portion toward the space, thereby forming an opening in the encircling structure. The wire 19 is inserted sideways through the opening and into the space, and the moved portion is released to enable the force of the urging structure 22 to move the portion toward the space and to clamp the wire between the portion and the rest of the encircling structure. The encircling structure is connected to an electrical device, such as a computer, to which the wire is electrically connected.

It will be apparent to those skilled in the art, and it is contemplated, that variations and/or changes in the embodiments illustrated and described herein may be made without departure from the present invention. Accordingly, it is intended that the foregoing description is illustrative only, not limiting, and that the true spirit and scope of the present invention will be determined by the appended claims.

The invention claimed is:

1. A restraint device comprising:
    a base member;
    a catch for receiving a wire;
    a movable member mounted on said base member, wherein said catch has a first surface extending transverse to said base member and a second surface extending at an angle from said first surface and toward said movable member, wherein said first and second surfaces define a space for receiving the wire, wherein said movable member is mounted for sliding movement relative to said catch from a first position, in which said movable member is spaced from said catch, such that the wire is able to be inserted sideways into the space defined by said first and second surfaces, to a second position, in which said movable member engages the wire and prevents the wire from being removed sideways from said space, wherein said movable member has a surface facing the space defined by said first and second surfaces, said surface facing the space being able to enter said space, at least when no wire is in the space, and wherein said second surface is spaced from said base member, and said space is between said second surface and said base member; and an urging structure resiliently urging said movable member from said first position to said second position.

2. The restraint device of claim 1, wherein, in said second position, when a wire is in said space, said movable member clamps the wire against said catch.

3. The restraint device of claim 1, wherein said space has a perimeter, said catch borders approximately half of the perimeter of said space, and said space is adapted to receive a wire in a direction intersecting said perimeter.

4. The restraint device of claim 3, wherein at least one of said catch and said movable member has a friction enhancing surface facing said space.

5. The restraint device of claim 4, wherein each of said catch and said movable member has a friction enhancing surface facing said space.

6. The restraint device of claim 1, wherein said second surface has a dimension along the perimeter of said space; said surface of said movable member facing said space has a dimension along the perimeter of said space; and said dimension of said surface of said movable member facing said space is generally equal to said dimension of said second surface.

7. The restraint device of claim 1, wherein said movable member has a finger-engageable friction enhancing surface.

8. The restraint device of claim 1, wherein said catch is connected to said base member.

9. The restraint device of claim 8, wherein said base member includes a housing, and said movable member is movably mounted in said housing and is in said housing in said first position.

10. The restraint device of claim 1, wherein said base member includes a housing, and said urging structure is positioned in said housing and is in said housing in said first position.

11. A restraint device comprising:
a base member;
a catch for receiving a wire;
a movable member mounted on said base member, wherein said catch has a first surface extending transverse to said base member and a second surface extending at an angle from said first surface and toward said movable member, wherein said first and second surfaces define a space for receiving the wire, wherein said movable member is mounted for sliding movement relative to said catch from a first position, in which said movable member is spaced from said catch, such that the wire is able to be inserted sideways into the space defined by said first and second surfaces, to a second position, in which said movable member engages the wire and prevents the wire from being removed sideways from said space, wherein said movable member has a surface facing the space defined by said first and second surfaces, said surface facing the space being able to enter said space, at least when no wire is in the space, wherein said space has a perimeter, said catch borders approximately half of the perimeter of said space, and said space is adapted to receive a wire in a direction intersecting said perimeter, wherein at least one of said catch and said movable member has a friction enhancing surface facing said space, and wherein said friction enhancing surface comprises at least one ridge extending parallel to said perimeter; and an urging structure resiliently urging said movable member from said first position to said second position.

12. A restraint device comprising:
a catch defining a space for receiving a wire; and
a movable member mounted for movement relative to said catch between a first position, in which said member is spaced from said catch, such that a wire is able to be inserted sideways into the space defined by the catch, and a second position, in which said movable member prevents the wire from being removed sideways from said space, wherein said space has a perimeter; said space is adapted to receive a wire in a direction intersecting said perimeter; said catch has a first surface and a second surface extending toward said movable member from said first surface, said first and second surfaces bordering said space, and wherein said movable member has a side facing said space; said side has a front surface; said second surface of said catch has a free end adjacent to said movable member; and said movable member is mounted for rectilinear movement parallel to said second surface of said catch.

13. A restraint device comprising:
a base member;
a catch for receiving a wire;
a movable member mounted on said base member, wherein said catch has a first surface extending transverse to said base member and a second surface extending at an angle from said first surface and toward said movable member, wherein said first and second surfaces define a space for receiving the wire, wherein said movable member is mounted for sliding movement relative to said catch from a first position, in which said movable member is spaced from said catch, such that the wire is able to be inserted sideways into the space defined by said first and second surfaces, to a second position, in which said movable member engages the wire and prevents the wire from being removed sideways from said space, wherein said movable member has a surface facing the space defined by said first and second surfaces, said surface facing the space being able to enter said space, at least when no wire is in the space, wherein said second surface has a dimension along the perimeter of said space, said surface of said movable member facing said space has a dimension along the perimeter of said space; and said dimension of said surface of said movable member facing said space is generally equal to said dimension of said second surface, and wherein said side of said movable member facing said space has a shoulder, and, in said second position of said movable member, said shoulder engages said free end of said second surface of said catch; and an urging structure resiliently urging said movable member from said first position to said second position.

14. A restraint apparatus comprising:
a mounting member; and
a restraint device secured to the mounting member, wherein the restraint device includes a catch defining a space for receiving a wire; and a movable member mounted for movement relative to said catch between a first position, in which said movable member is spaced from said catch, such that a wire is able to be inserted sideways into the space defined by the catch, and a second position, in which said movable member prevents a wire from being removed sideways from said space, wherein said catch and said movable member protrude from a first surface of the mounting member, wherein said space is also defined by said first surface of the mounting member; said space has a perimeter; said catch borders approximately half of the perimeter of said space; said catch has a free end; a gap is defined between said free end and said first surface of the mounting member; and, in said first position of said movable member, a wire is insertable sideways through said gap and into said space, and wherein said mounting member has a second surface opposite to said first surface, and said restraint device further includes a base member secured on said second surface, wherein said movable member is movably mounted on said base member.

15. The restraint apparatus of claim 14, wherein, in said second position of said movable member, said movable member closes said gap.

16. The restraint apparatus of claim 14, wherein said catch is connected to said base member.

17. The restraint apparatus of claim 16, wherein said restraint device further includes an urging structure resiliently urging said movable member toward said second position.

18. The restraint apparatus of claim 17, wherein said base member includes a housing, and said urging structure is positioned in said housing.

19. The restraint apparatus of claim 14, wherein said base member includes a housing, and said movable member is movably mounted in said housing.

20. A method for restraining a wire from movement, comprising providing an encircling structure that encircles a space through which the wire can extend, the encircling structure including a movable portion, a base member, a first surface extending transversely from the base member and a second surface spaced from base member and extending generally parallel to the base member toward the movable portion, wherein the second surface has a free end;

opening the encircling structure by sliding the movable portion of the encircling structure on said base member rectilinearly away from the first surface, and parallel to the second surface, against the force of an urging structure urging the movable portion toward the space, thereby forming an opening in the encircling structure;

inserting the wire sideways through the opening and into the space; and releasing the movable portion to enable the force of the urging structure to slide the movable portion rectilinearly toward the space and clamp the wire between the movable portion and the rest of the encircling structure.

21. The method of claim 20, further comprising connecting the encircling structure to an electrical device to which the wire is electrically connected.

* * * * *